(12) United States Patent
Nishibe et al.

(10) Patent No.: US 7,217,612 B2
(45) Date of Patent: May 15, 2007

(54) MANUFACTURING METHOD FOR A SEMICONDUCTOR DEVICE WITH REDUCED LOCAL CURRENT

(75) Inventors: Eiji Nishibe, Gunma (JP); Shuichi Kikuchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 298 days.

(21) Appl. No.: 10/809,011

(22) Filed: Mar. 25, 2004

(65) Prior Publication Data

US 2004/0178459 A1    Sep. 16, 2004

Related U.S. Application Data

(62) Division of application No. 10/007,384, filed on Oct. 22, 2001, now abandoned.

(30) Foreign Application Priority Data

Dec. 7, 2000    (JP)    ............ P 2000-372228

(51) Int. Cl.
*H01L 21/8238* (2006.01)
*H01L 21/336* (2006.01)
(52) U.S. Cl. ............ 438/217; 438/289; 438/301; 257/E21.217; 257/E21.268; 257/E21.455
(58) Field of Classification Search ............ 438/301, 438/257, 217, 289, 268, 526; 257/E21.217, 257/E21.268, E21.455
See application file for complete search history.

(56) References Cited

U.S. PATENT DOCUMENTS 6,255,154 B1 *   7/2001   Akaishi et al. ............ 438/217
2002/0050619 A1 *   5/2002   Kawaguchi et al. ........ 257/368

FOREIGN PATENT DOCUMENTS

| JP | 03-077463 U | 3/1991 |
| JP | 04-154173 | 5/1992 |
| JP | 04-162678 | 6/1992 |
| KR | 1999-38946 | 6/1999 |
| KR | 1999-0041054 | 6/1999 |

* cited by examiner

Primary Examiner—Walter Lindsay, Jr.
(74) Attorney, Agent, or Firm—Fish & Richardson P.C.

(57) ABSTRACT

A semiconductor device including: a first gate insulating film which is pattern-formed on an N type well region within a P type semiconductor substrate; a second gate insulating film which is formed on the semiconductor substrate except for this first gate insulating film; a gate electrode, which is formed in such a manner that this gate electrode is bridged over the first gate insulating film and the second gate insulating film; a P type body region which is formed in such a manner that this P type body region is located adjacent to the gate electrode; an N type source region and a channel region, which are formed within this P type body region; and an N type drain region which is formed at a position separated from the P type body region.

7 Claims, 5 Drawing Sheets

MANUFACTURING METHOD FOR A SEMICONDUCTOR DEVICE WITH REDUCED LOCAL CURRENT

CROSS-REFERENCE TO RELATED APPLICATION(S)

This application is a divisional of U.S. Ser. No. 10/007,384, filed Oct. 22, 2001 now abandoned.

BACKGROUND OF THE INVENTION

The present invention is related to a semiconductor device and a method for manufacturing the semiconductor device. More specifically, the present invention is directed to an LD (Lateral Double Diffused) MOS (Metal-Oxide Semiconductor) transistor technique functioning as a high voltage element which is utilized as, for instance, a liquid crystal driving IC.

In this case, an LDMOS transistor structure implies such a transistor structure that impurities having different conductive types are diffused with respect to a region formed on the side of a surface of a semiconductor substrate so as to form new regions, and a difference between diffusions of these regions along a lateral direction is utilized as an effective channel length. Since a short channel is formed, the resulting transistor structure may constitute such an element suitably having a lower ON-resistance value.

FIG. 9 is a sectional diagram for explaining a conventional LDMOS transistor, as one example thereof, for representing an N-channel type LDMOS transistor structure. It should be noted that while a description as to a P-channel type LDMOS transistor structure is omitted, as is well known in this field, this P-channel type LDMOS transistor owns a similar structure of the N-channel type LDMOS transistor except for the conductive type thereof.

In FIG. 9, reference numeral 51 shows one conductive type semiconductor substrate, for example, a P type semiconductor substrate (P-Sub), and reference numeral 52 represents an N type well region. In this N type well region (N well) 52, a P type body region (PB) 53 is formed, whereas an N type (N$^+$) region 54 is formed in the above-explained N type well region 53, and another N type (N$^+$) region 55 is formed in the N type well region 52. Also, a gate electrode 58 is formed on a surface of the semiconductor substrate in such a manner that this gate electrode 58 is bridged between a first gate insulating film 56 and a second gate insulating film 57, the film thickness of which is thinner than that of the first gate insulating film 56. A channel region 59 is formed in a surface region of the P type body region 53 located just under this gate electrode 58.

Then, the above-explained N$^+$ type region 54 is used as a source region, the N$^+$ type region 55 is used as a drain region, and the N type well region 52 is used as a drift region. Also, reference numeral 60 shows a device separation film, symbol "S" denotes a source electrode, symbol "G" indicates a gate electrode, and symbol "D" represents a drain electrode. Reference numeral 61 shows a P type (P$^+$) region which is employed so as to secure a potential of the P type body region 53. Also, reference numeral 62 shows an interlayer insulating film.

In the above-explained LDMOS transistor, since the N type well region 52 is formed in the diffusion manner, concentration at the surface of the N type well region 52 is increased, so that a current can easily flow on the surface of the N type well region 52, and also, this LDMOS transistor can be operated under high voltages, namely can have a high-voltage-withstanding characteristic.

In the above-described LDMOS transistor, the simulation result could reveal such a fact that local current crowding (namely, region "A" shown in FIG. 9) may occur between an edge portion of the P type body region 53 and an edge portion of the first gate insulating film 56, and thus, a current can very hardly flow between the source of this LDMOS transistor and the drain thereof.

As a consequence, in particular, when the drain voltage is low, there is a lack of drive capability of the LDMOS transistor, so that this LDMOS transistor can be hardly turned ON.

The occurrence cause of this local current crowding is given by such a fact that equipotential lines are crowded in such a space which is surrounded by an edge portion (wall) of the above-explained first gate insulating film 56 and an edge portion (wall) of the P type body region 53. More precisely speaking, while the equipotential lines may be distributed by widening the space which is surrounded by the edge portion (wall) of the first gate insulating film 56 and the edge portion (wall) of the P type body region 53, this measure may disturb, or impede that the LDMOS transistor is manufactured in very fine manners.

SUMMARY OF THE INVENTION

The present invention has an object to reduce local current crowding in such a manner that a concave/convex region at a boundary surface between a semiconductor substrate (Si) and a gate insulating film (SiO$_2$ film) is eliminated so as to distribute equipotential lines.

Therefore, in order to solve the above-explained problem, a semiconductor device, according to an aspect of the present invention, is featured by comprising: for instance, a first gate insulating film which is pattern-formed on a second conductive type well region within a first conductive type semiconductor substrate in such a manner that a side wall portion of the first gate insulating film is made in a taper shape; a second gate insulating film which is formed on the semiconductor substrate except for the first gate insulating film; a gate electrode which is formed in such a manner that the gate electrode is bridged over the first gate insulating film and the second gate insulating film; a first conductive type body region which is formed in such a manner that the first conductive type body region is located adjacent to the gate electrode; a second conductive type source region and a channel region, which are formed within the first conductive type body region; and a second conductive type drain region which is formed at a position separated from the first conductive type body region.

Also, the first gate insulating film of the above-described semiconductor device is not formed at a position lower than at least a surface position of the semiconductor substrate.

As a result, local current crowding is not produced between at least an edge portion of the first conductive type body region and an edge portion of the first gate insulating film.

Also, a manufacturing method of this semiconductor device is featured as follows: That is, a second conductive type impurity ion is implanted into a first conductive type semiconductor substrate and then is diffused in the semiconductor substrate so as to form a second conductive type well region, and while a resist film formed on a predetermined region of the second conductive type well region is used as a mask, a first conductive type impurity ion is implanted and then is diffused so as to form a first conductive type body region. Next, after a surface region of the semiconductor substrate is field-oxidized by way of the LOCOS method to thereby form an insulating film, while a resist film formed on a predetermined region of the insulating film is employed as a mask, the insulating film is patterned so as to form a first insulating film. Subsequently, a second gate insulating film is formed on the semiconductor substrate other than the first gate insulating film, and a gate electrode is formed in such a manner that the gate electrode is bridged over the first gate insulating film and the second gate insulating film. Furthermore, while a resist film having an opening is employed as a mask, the second conductive type impurity ion is implanted into both a source forming region formed within the first conductive type body region and a drain forming region formed within the second conductive type well region so as to form a source region and a drain region.

Furthermore, in accordance with the above-described manufacturing method of the semiconductor device, the step for forming the first gate insulating film is the same step as a step for forming a device separation film.

Also, in accordance with the manufacturing method of the semiconductor device, in the step for forming the first gate insulating film, the first gate insulating film is not formed at a position lower than at least a surface position of the semiconductor substrate.

DETAILED DESCRIPTION OF THE PREFERRED EMBODIMENT

Referring now to drawings, a description will be made of an embodiment of the present invention with respect to a semiconductor device and a manufacturing method thereof.

Figure 8:
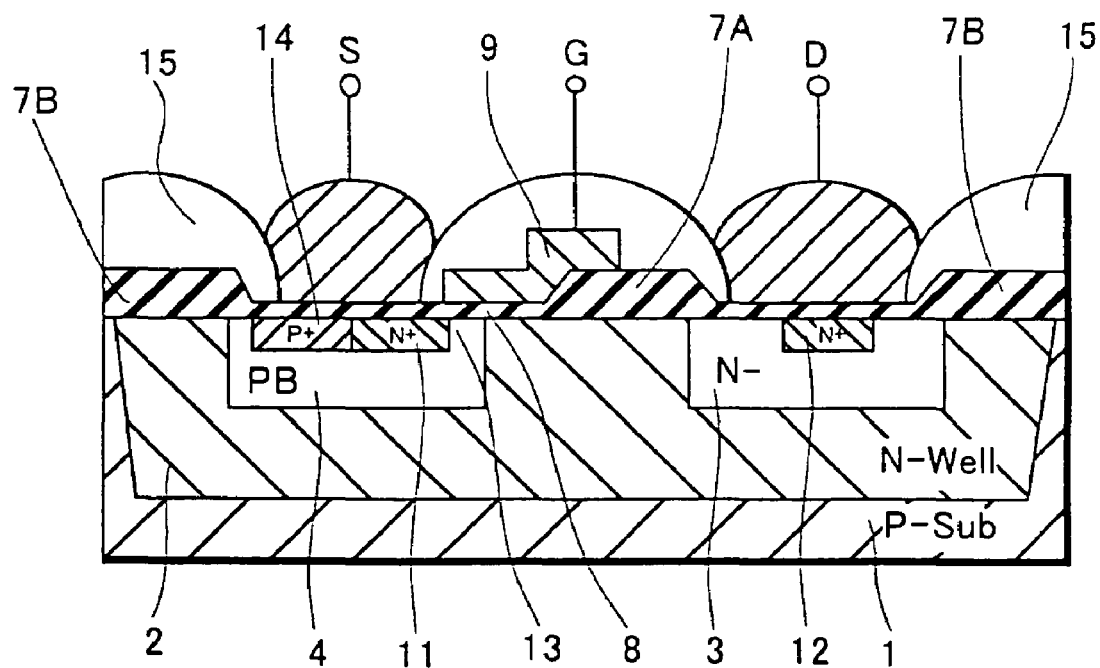
FIG. 8 is a sectional view for showing the manufacturing method of the semiconductor device according to one embodiment of the present invention.

FIG. 8 is a sectional view for showing a semiconductor device according to the present invention, more specifically, for explaining an LDMOS transistor, as one example thereof, for representing an N-channel type LDMOS transistor structure. It should be noted that while a description as to a P-channel type LDMOS transistor structure is omitted, as is well known in this field, this P-channel type LDMOS transistor owns a similar structure of the N-channel type LDMOS transistor except for the conductive type thereof.

In FIG. 8, reference numeral 1 shows one conductive type semiconductor substrate, for example, a P type semiconductor substrate (P-Sub), and reference numeral 2 represents an N type well region (N well). In this N type well region 2, a P type body region (PB) 4 is formed, whereas an N type ($N^+$) region 11 is formed in the above-explained P type body region 4, and another N type ($N^-$) region 3 is formed in the N type well region 2. Also, another N type ($N^+$) region 12 is formed in this N type ($N^-$) region 3.

Further, a gate electrode 9 is formed on a surface of the semiconductor substrate in such a manner that this gate electrode 9 is bridged between a first gate insulating film 7A and a second gate insulating film 8, the film thickness of which is thinner than that of the first gate insulating film 7A. A channel region 13 is formed in a surface region of the P type body region 4 located just under this gate electrode 9.

Then, the above-explained $N^+$ type region 11 is used as a source region, both the $N^-$ type region 3 and the $N^+$ type region 12 are used as a drain region, and the N type well region 2 is used as a drift region. Also, reference numeral 7B shows a device separation film, symbol "S" denotes a source electrode, symbol "G" indicates a gate electrode, and symbol "D" represents a drain electrode. Reference numeral 14 shows a P type ($P^+$) region which is employed so as to secure a potential of the P type body region 4. Also, reference numeral 15 shows an interlayer insulating film.

In this case, the semiconductor device of the present invention has a feature where, as indicated in FIG. 8, the first gate insulating film 7A is not formed at such a position lower than, at least, the surface position of the semiconductor substrate 1.

Figure 9:
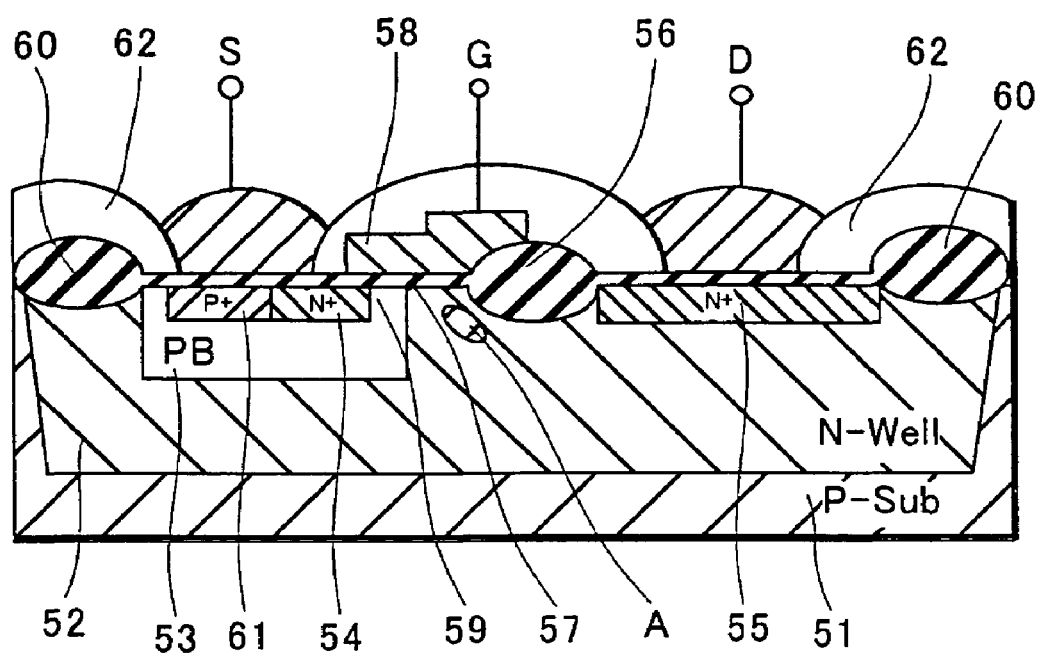
FIG. 9 is a sectional view for representing the conventional semiconductor device.

As a consequence, the semiconductor device of the present invention owns such a structure that the local current crowding does not occur between the edge portion of the P type body region and the edge portion of the first gate insulating film, as compared with the structure of the conventional semiconductor device (FIG. 9) in which the first gate insulating film 56 is formed under the surface of the substrate.

Next, a method of manufacturing the above-described semiconductor device will now be described with reference to drawings.

Figure 1:
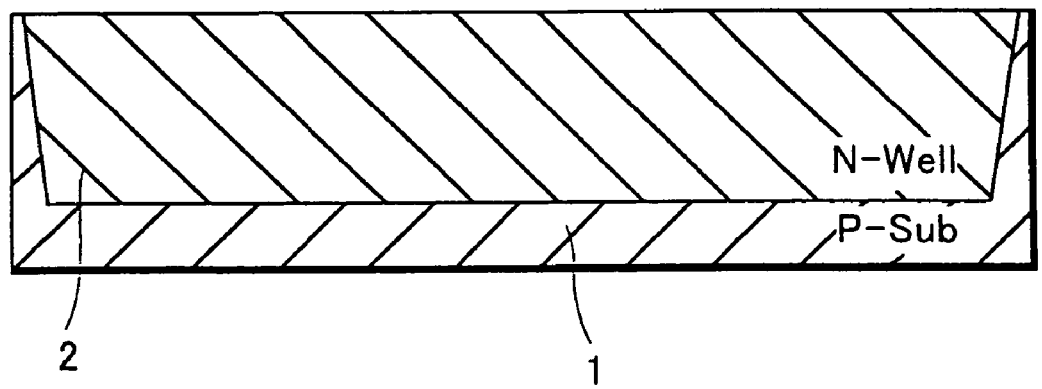
FIG. 1 is a sectional view for indicating a manufacturing method of a semiconductor device according to an embodiment of the present invention.

First, in FIG. 1, while a resist film (not shown) is used as a mask and this resist film is formed on, for example, the P type semiconductor substrate 1, an N type impurity is implanted in an ion-implantation manner into a desirable region of the substrate 1. Since this N type impurity is diffused in a desirable region, the N type well region 2 may be formed. In this case, the above-explained N type well region 2 may constitute the drift region. It should also be noted that in this manufacturing step, as the N type impurity, for example, a phosphorus ion is implanted at an acceleration energy of approximately 160 keV and a dose of approximately $5.0 \times 10^{12}/cm^2$, and this phosphorus iron is thermally diffused at a temperature of about 1,200° C. and for 13 hours.

Figure 2:
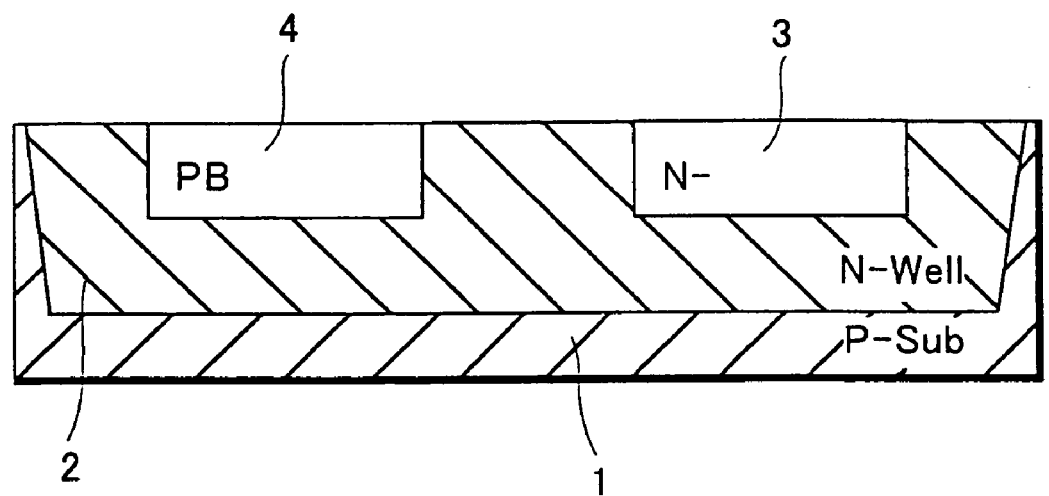
FIG. 2 is a sectional view for showing the manufacturing method of the semiconductor device according to one embodiment of the present invention.

Also, while the first resist film (not shown) formed on the substrate 1 is employed as a mask, an N type impurity (for example, phosphorus ion) is implanted. After this first resist film has been removed, while a second resist film (not shown) formed on the substrate 1 is used as a mask, a P type impurity (for example, boron ion) is implanted and diffused. As a result, both the $N^-$ type region 3 and the P type body region 4 are formed within the above-described N type well region 2 (see FIG. 2). It should also be understood that in this manufacturing step, for instance, the phosphorus ion is implanted at the acceleration energy of approximately 100 KeV and the dose of approximately $4.0 \times 10^{12}/cm^2$. Also, for example, the boron ion is implanted at the acceleration energy of approximately 80 KeV, and the dose of approximately $1.5 \times 10^{13}/cm^2$. Thereafter, these phosphorus and boron ions are thermally diffused at the temperature of approximately 1,050° C. and for 2 hours.

Figure 3:
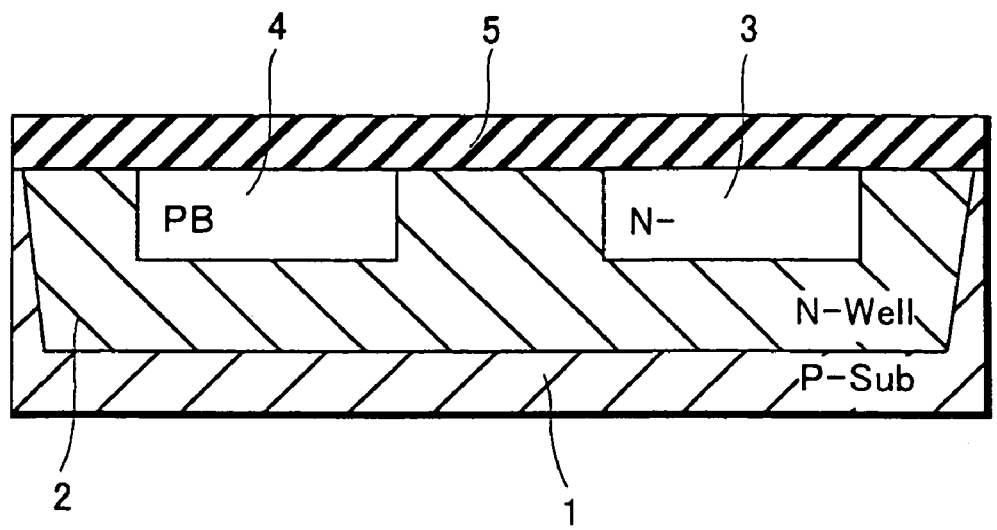
FIG. 3 is a sectional view for representing the manufacturing method of the semiconductor device according to one embodiment of the present invention.

Subsequently, in FIG. 3, an oxidation resistance film (for instance, silicon nitride film, not shown) having an opening is formed on both a pad oxide film (not shown) and a predetermined region (not shown), which are formed on the substrate 1. Then, while both the anti-oxidation film and the pad oxide film are employed as a mask, the resulting semiconductor substrate is field-oxidized by way of the LOCOS (local oxidation of silicon) method, so that an insulating film 5 having a film thickness of approximately 1100 nm is formed.

Figure 4:
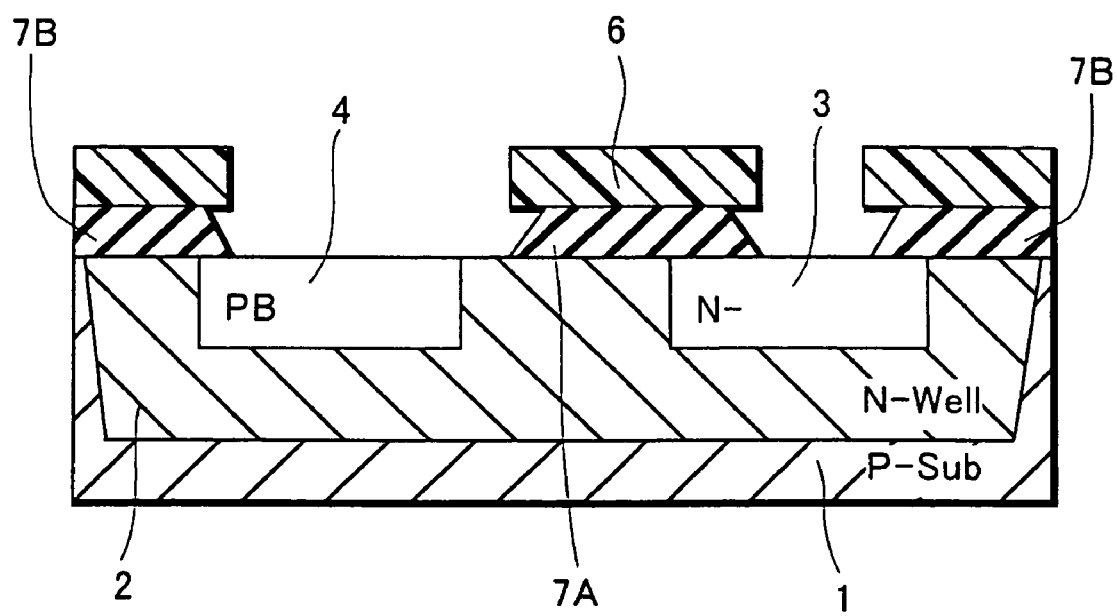
FIG. 4 is a sectional view for showing the manufacturing method of the semiconductor device according to one embodiment of the present invention.

Next, in FIG. 4, while a third resist film 6 is employed as a mask and this third resist film 6 has been formed on a predetermined region over the above-described insulating film 5, this insulating film 5 is patterned to form both the first gate insulating film 7A and the device separation film 7B. It should also be noted that in this manufacturing step, since the above-described insulating film 5 is etched away by the isotropic etching method by using hydrofluoric acid, this insulating film 5 is patterned in such a manner that a side wall portion of this insulating film 5 is made in a taper shape. Alternatively, such an isotropic etching treatment that a wet etching process is combined with a dry etching process may be used, and a dry etching treatment using isotropic gas may be employed.

Figure 5:
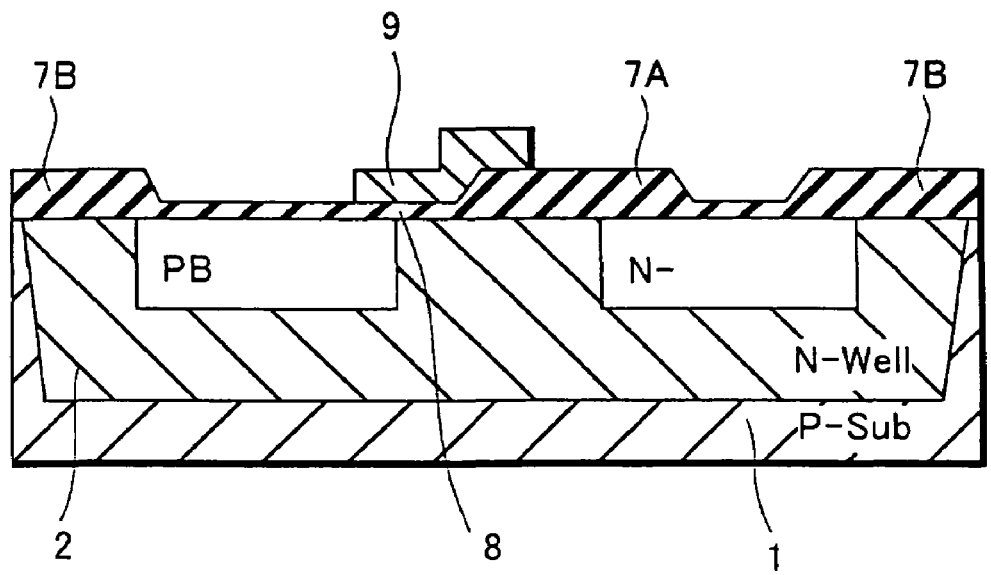
FIG. 5 is a sectional view for representing the manufacturing method of the semiconductor device according to one embodiment of the present invention.

Subsequently, in FIG. 5, the surface of the substrate 1 except for both the first gate insulating film 7A and the device separation film 7B are thermally oxidized so as to form such a second gate insulating film 8 having a thickness of approximately 45 nm, and a gate electrode 9 is formed in such a manner that this gate electrode 9 is bridged from this second gate insulating film 8 and over the first gate insulating film 7A. It should be understood that the gate electrode 9 of the LDMOS transistor according to this embodiment is made of a polysilicon film which is manufactured in such a manner that while $POCl_3$ is employed as a thermal diffusion source, a phosphorus ion is doped and the ion-doped polysilicon film is made conductive. More specifically, this gate electrode 9 may be constituted by a polycide electrode manufactured in such a manner that a tungsten silicide (WSix) is stacked on this polysilicon film.

Figure 6:
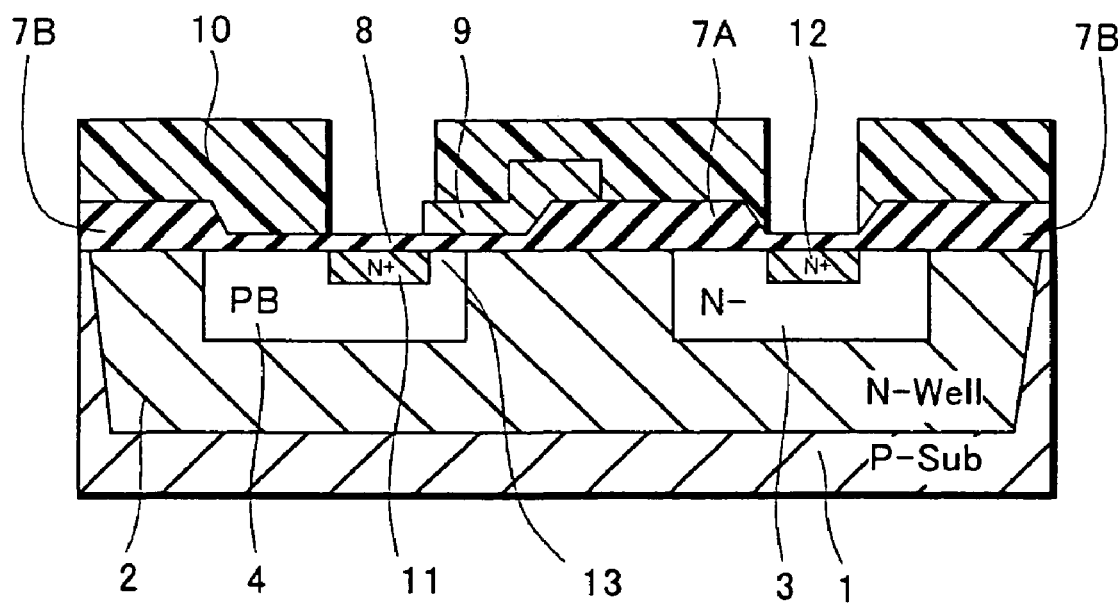
FIG. 6 is a sectional view for showing the manufacturing method of the semiconductor device according to one embodiment of the present invention.

Also, in FIG. 6, while a fourth resist film 10 having an opening portion is used as a mask, an N type impurity is implanted into a source forming region which is formed within the P type body region 4, and also into a drain forming region which is formed within the N⁻ type region 3, so that both N type (N⁺) regions 11 and 12 which will constitute a source region and a drain region are formed. It should also be understood that in this manufacturing step, for instance, when source/drain regions having a so-called "LDD structure" are formed, first of all, while the resist film 10 shown in FIG. 6 is employed, for example, a phosphorus ion is implanted at the acceleration energy of approximately 70 keV and the dose of approximately $1.0 \times 10^{14}/cm^2$. Thereafter, although not shown in this drawing but also no explanation is made, a side wall spacer film is formed on a side wall portion of the gate electrode 9. Under such a condition that the fourth resist film has been again formed, for instance, arsenic ion is implanted at the acceleration energy of approximately 70 keV and the dose of approximately $6.0 \times 10^{16}/cm^2$. Apparently, in this embodiment, the structures of the source/drain regions are not limited to the above-explained LDD structure.

Figure 7:
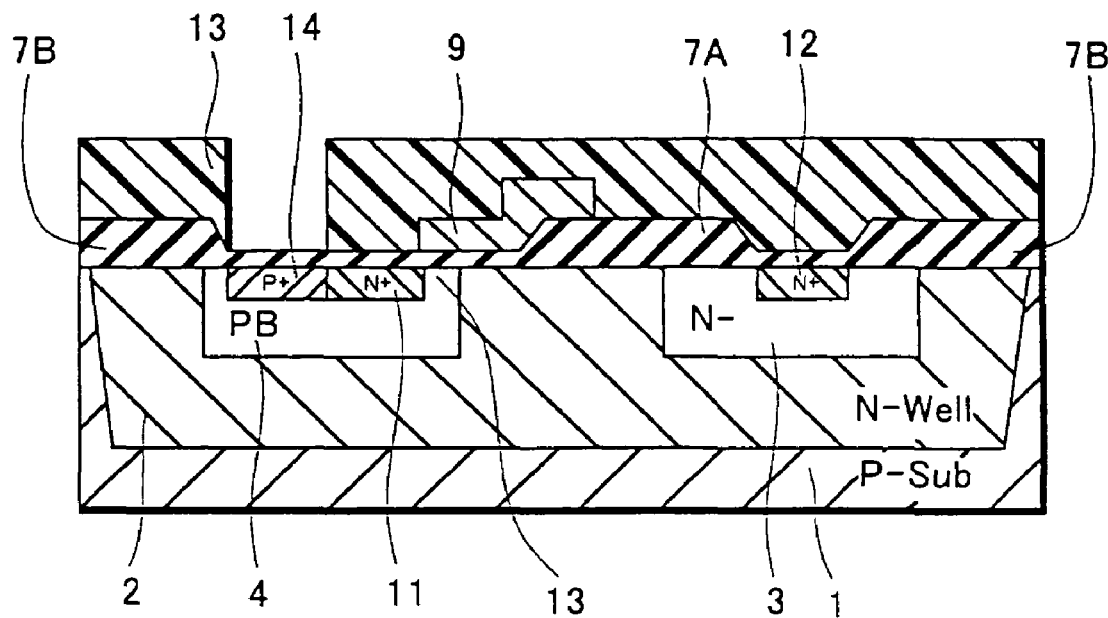
FIG. 7 is a sectional view for representing the manufacturing method of the semiconductor device according to one embodiment of the present invention.

Also, in FIG. 7, in order to secure a potential of the P type body region 4, while the fifth resist film 13 is employed as a mask, a P type impurity (for example, boron difluoride ion) is implanted at a position adjacent to the above-explained N⁺ type region 11 so as to form a P type (P⁺) region 14. It should also be noted that in this manufacturing step, for example, a boron difluoride ion is implanted at the acceleration energy of 60 keV and the dose of $4 \times 10^{16}/cm^2$.

Then, in FIG. 8, the interlayer insulating film 15 is formed so that this interlayer insulating film 15 covers an entire surface of the resulting semiconductor device, and contact holes (not shown) are formed in the interlayer insulating film 15. Then, the source electrode S, the drain electrode D and the gate electrode G are respectively formed via the contact hole. Next, although the description with reference to the drawings is not made, a passivation film is formed on the entire surface of the semiconductor device, so that the semiconductor device may be accomplished.

As previously described, the semiconductor device manufacturing method according to the present invention is different from the conventional manufacturing method for manufacturing the first gate insulating film and the device separation film, and has a feature that the insulating film 5 is formed on the semiconductor substrate 1 by way of the LOCOS method, and then, this formed insulating film 5 is patterned in the desirable shape so as to form both the first gate insulating film 7A and the device separation film 7B. As a result, the first gate insulating film 7A is not formed at such a position lower than, at least, the surface position of the substrate. As a consequence, in accordance with the present invention, there is no such a concave/convex region formed at the boundary surface between the semiconductor substrate (Si) and the gate insulating film (SiO₂ film). Therefore, no local current crowding is produced between the edge portion of the P type body region 53 and the edge portion of the first gate insulating film 56, which is different from the background art (see FIG. 9). As a result, the current may easily flow between the source and the drain of the semiconductor device, so that the ON-resistance value of this semiconductor device can be lowered.

Also, since the above-explained structure is employed, the equipotential lines are no longer distributed by widening the space which is surrounded by both the edge portion (wall) of the first gate insulating film 7A and the edge portion (wall) of the P type body region 4. This structure does not disturb, or impede that this semiconductor device is manufactured in very fine manners.

Further, in accordance with this embodiment, the surface of the substrate 1 is field-oxidized by way of the LOCOS method so as to form the insulating film 5, and the resultant insulating film 5 is patterned, so that the first gate insulating film 7A and the device separation film 7B are formed. However, the present invention is not limited to this manufacturing method. Alternatively, for example, while an oxide film is formed on the substrate by way of the CVD method, this formed oxide film is patterned in a desirable shape, so that the first gate insulating film 7A and the device separation film 7B may be formed.

As previously explained, the semiconductor device of the present invention may be accomplished by employing not only the LOCOS method, but also the CVD method. Precisely speaking, when the CVD method is compared with the LOCOS method, this LOCOS method owns the below-mentioned merits.

First, the thermal oxide film which is formed by employing the LOCOS method owns the higher quality than that of the oxide film which is formed by using the CVD method. As a result, the reliability may be improved. Also, there is no increase in the step for forming the CVD oxide film. Furthermore, the better matching characteristic of this oxide film formed by the LOCOS method with respect to another region and another device may be achieved. In other words, for example, as previously explained in this embodiment, the LOCOS device separation film may be used in accordance with the LOCOS method similar to the background art. To the contrary, when the CVD method is employed, such a LOCOS film may not be used also in another region.

In accordance with the present invention, since the first gate insulating film is not formed at the position lower than at least the surface position of the substrate, the local current crowding does not occur between the edge portion of one conductive type body region and the edge portion of the first gate insulating film. This local current crowding occurs in the background art.

Also, since the insulating film having such a high quality is employed which is formed by the LOCOS method, the reliability can be improved.

In addition, in accordance with the manufacturing method of the present invention, since the insulating film is manufactured by way of the LOCOS method, the better matching characteristic of this insulating film with respect to other regions and also other devices can be realized.

What is claimed is:

1. A method for manufacturing a semiconductor device, comprising the steps of:

forming a body region by implanting to diffuse an impurity in a predetermined region of a semiconductor layer;

after field-oxidizing a surface region of said semiconductor layer by way of the LOCOS method to form an insulating film, forming a first gate insulating film by patterning said insulating film while a resist film formed on a predetermined region of said insulating film is employed as a mask;

forming a second gate insulating film on said semiconductor layer other than said first gate insulating film, and then forming a gate electrode so that said gate electrode is bridged over said first gate insulating film and said second gate insulating film; and forming a source region and drain region by implanting an impurity of an opposite conductive type to said body region into both a source forming region formed within said body region and a drain forming region formed within said semiconductor layer while a resist film having an opening is employed as a mask, wherein said first gate insulating film is not formed at a position lower than at least a surface position of said semiconductor layer in the step of forming said first gate insulating film.

2. The semiconductor device manufacturing method as claimed in claim 1, wherein a device separation film is formed in the same step of forming said first gate insulating film.

3. A method for manufacturing a semiconductor device, comprising the steps of:

forming a body region by implanting to diffuse an impurity in a predetermined region of a semiconductor layer;

after field-oxidizing a surface region of said semiconductor layer by way of the LOCOS method to form an insulating film, forming a first gate insulating film by patterning said insulating film while a resist film formed on a predetermined region of said insulating film is employed as a mask;

forming a second gate insulating film on said semiconductor layer other than said first gate insulating film, and then forming a sate electrode so that said gate electrode is bridged over said first sate insulating film and said second gate insulating film; and forming a source region and drain region by implanting an impurity of an opposite conductive type to said body region into both a source forming region formed within said body region and a drain forming region formed within said semiconductor layer while a resist film having an opening is employed as a mask , wherein, in the step of forming the first gate insulating film, said first gate insulating film is not formed at a position lower than a surface position of said semiconductor layer so that local current crowding is not produced between at least an edge portion of said body region and an edge portion of said first gate insulating film.

4. A method for manufacturing a semiconductor device, comprising the steps of:

forming a body region by implanting to diffuse an impurity in a predetermined region of a semiconductor layer;

after field-oxidizing a surface region of said semiconductor layer by way of the LOCOS method to form an insulating film, forming a first sate insulating film by patterning said insulating film while a resist film formed on a predetermined region of said insulating film is employed as a mask;

forming a second gate insulating film on said semiconductor layer other than said first gate insulating film, and then forming a sate electrode so that said sate electrode is bridged over said first gate insulating film and said second gate insulating film; and forming a source region and drain region by implanting an impurity of an opposite conductive type to said body region into both a source forming region formed within said body region and a drain forming region formed within said semiconductor layer while a resist film having an opening is employed as a mask wherein the first gate insulating film is not formed at a position lower than at least a surface position of the source region and the drain region, in the step of forming said first gate insulating film.

5. The semiconductor device manufacturing method according to claim 1 wherein the first gate insulating film is not formed at a position lower than at least a surface position of the source region and the drain region, in the step of forming said first gate insulating film.

6. The semiconductor device manufacturing method as claimed in claim 3, wherein a device separation film is formed in the same step of forming said first gate insulating film.

7. The semiconductor device manufacturing method as claimed in claim 4, wherein a device separation film is formed in the same step of forming said first gate insulating film.

* * * * *